United States Patent
Campanella Pineda et al.

(10) Patent No.: US 10,784,833 B2
(45) Date of Patent: Sep. 22, 2020

(54) LAMB ACOUSTIC WAVE RESONATOR AND FILTER WITH SELF-ALIGNED CAVITY VIA

(71) Applicant: VANGUARD INTERNATIONAL SEMICONDUCTOR SINGAPORE PTE. LTD., Singapore (SG)

(72) Inventors: Humberto Campanella Pineda, Singapore (SG); Anthony Kendall Stamper, Burlington, VT (US); Jeffrey C. Maling, Grand Isle, VT (US); Sharath Poikayil Satheesh, Singapore (SG); You Qian, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 46 days.

(21) Appl. No.: 15/478,941

(22) Filed: Apr. 4, 2017

(65) Prior Publication Data

US 2018/0287587 A1 Oct. 4, 2018

(51) Int. Cl.
*H03H 9/02* (2006.01)
*H03H 3/02* (2006.01)

(52) U.S. Cl.
CPC .......... *H03H 3/02* (2013.01); *H03H 9/02228* (2013.01); *H03H 2003/021* (2013.01)

(58) Field of Classification Search
CPC .......... H03H 9/54; H03H 3/02; H01L 41/047
USPC ........................................................ 333/187
See application file for complete search history.

(56) References Cited

U.S. PATENT DOCUMENTS

| 7,528,685 | B2 | 5/2009 | Tanaka | |
|---|---|---|---|---|
| 7,535,152 | B2 | 5/2009 | Ogami et al. | |
| 7,728,483 | B2 | 6/2010 | Tanaka | |
| 7,965,015 | B2 | 6/2011 | Tai et al. | |
| 2008/0169885 | A1* | 7/2008 | Ueda | H03H 3/04 333/187 |
| 2012/0274647 | A1* | 11/2012 | Lan | H03H 3/0072 345/531 |

(Continued)

OTHER PUBLICATIONS

Yen et al., "Synthesis of Narrowband AlN Lamb Wave Ladder-Type Filters Based on Overhang Adjustment", Article in the University of California at Berkeley, Berkeley, CA, USA, Nov. 2010 IEEE International Ultrasonics Symposium Proceedings, retrieved on Apr. 4, 2017, from https://www.researchgate.net/publication/224244175_Synthesis_of_narrowband_AlN_Lamb_wave_ladder-type_filters_based_on_overhang_adjustment, pp. 970-973, 4 Pages.

*Primary Examiner* — Samuel S Outten
(74) *Attorney, Agent, or Firm* — Winston Hsu (57) ABSTRACT

A method for forming a lamb acoustic wave resonator and filter and the resulting device are provided. Embodiments include forming a sacrificial layer over a substrate; forming a first electrode over the sacrificial layer; forming a piezoelectric thin film over the first electrode; forming a second electrode over the piezoelectric thin film; forming a hardmask over the second electrode; etching through the hardmask and the second electrode down to the piezoelectric thin film forming self-aligned vias; forming and patterning a photoresist layer over the self-aligned vias; etching through the photoresist layer forming cavities extending through the vias and to the sacrificial layer; and removing the sacrificial layer forming a cavity gap under the cavities and first metal electrode.

9 Claims, 5 Drawing Sheets

(56) References Cited

U.S. PATENT DOCUMENTS

2014/0117815 A1\* 5/2014 Bi ............................ H03H 3/04
310/346
2014/0166463 A1 6/2014 Jahnes et al.

\* cited by examiner

LAMB ACOUSTIC WAVE RESONATOR AND FILTER WITH SELF-ALIGNED CAVITY VIA

TECHNICAL FIELD

The present disclosure relates to semiconductor fabrication. In particular, the present disclosure relates to acoustic wave filters and resonator fabrication in the advanced technology nodes.

BACKGROUND

Stand alone acoustic wave filters and resonators are used in radio frequency (RF) front-end modules for mobile applications. Multi-band capability combining bulk acoustic wave (BAW) filters and Lamb acoustic wave filters is required. Lamb-wave filters require tight tolerance for their cavity via acoustic boundary conditions, particularly when targeting high frequency bands above 2 gigahertz (GHz). Small misalignments between a cavity via and an interdigital transducer (IDT) electrode change acoustic boundaries. Misalignments even as small as 50 nanometers (nm), in the cavity via edge for a 2 GHz filter electrode change the acoustic boundary conditions and resonant frequency. Current solutions include lithographic alignment of the cavity via or a buried cavity underneath. However, achieving perfect alignment is not possible even with the most sophisticated lithographic tools.

A need therefore exists for methodology enabling the effective control of overlay misalignment to optimize a filter's frequency spectral response, and the resulting device.

SUMMARY

An aspect of the present disclosure is to define a tolerance of misalignment (i.e., maximum overlay) between a cavity via and IDT electrode layer in order to optimize filter performance. An aspect of the present disclosure is to provide a self-aligner that absorbs photolithographic misalignments between a cavity via and IDT electrode layers. The self-alignment pattern uses the same layer of a top IDT electrode and eliminates an extra mask layer. The self-aligner adds minimum complexity to the structure design.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a sacrificial layer over a substrate; forming a first electrode over the sacrificial layer; forming a piezoelectric thin film over the first electrode; forming a second electrode over the piezoelectric thin film; forming a hardmask over the second electrode; etching through the hardmask and the second electrode down to the piezoelectric thin film forming self-aligned vias; forming and patterning a photoresist layer over the self-aligned vias; etching through the photoresist layer forming cavities extending through the vias and to the sacrificial layer; and removing the sacrificial layer forming a cavity gap under the cavities and first metal electrode.

Aspects of the present disclosure include forming a dielectric hardmask over the second metal electrode. Other aspects include reactive ion etching (RIE) through the photoresist layer forming the cavities. Certain aspects include removing the sacrificial layer by mechanical and/or chemical etching. Yet further aspects include removing the photoresist layer after the cavity gap is formed. Other aspects include forming the piezoelectric thin film of aluminum nitride (AlN), scandium-doped AlN (ScAlN), zinc oxide (ZnO), lithium niobate/tantalate ($LiNbO_3$/$LiTaO_3$), or lead zirconate titanate (PZT). Certain aspects include forming the first and second electrodes of metal comprising molybdenum (Mo), chromium (Cr), or tungsten (W). Another aspect includes forming the second electrode as an IDT electrode. Further aspects include forming an upper support; and forming another cavity gap between the support and the second electrode.

Another aspect of the present disclosure is a device including a substrate; a first electrode formed over the substrate; a first cavity gap disposed between the substrate and first electrode; a piezoelectric thin film formed over the first electrode; a patterned second electrode formed over the piezoelectric thin film; first and second self-aligned cavities extending through the patterned second electrode down to the cavity gap, wherein the first cavity gap connects the first and second self-aligned cavities; an upper support formed over the patterned second electrode; and a second cavity gap disposed between the patterned second electrode and the upper support.

Aspects of the present disclosure include a patterned hardmask formed over the patterned second electrode, wherein a pattern of the hardmask is the same as a pattern of the second electrode. Other aspects include the first electrode and the second patterned electrode including a metal selected from Mo, Cr or W. Other aspects include the device as an acoustic resonator filter, wherein the piezoelectric thin film forms an acoustic layer, the second metal electrode transduces an acoustic signal from the acoustic layer and determines a central resonance frequency of the filter, and the first and second self-aligned cavities provide frequency control of a resonance frequency of the acoustic resonator filter by fixing a distance between the second metal electrode and the first and second self-aligned cavities. Certain aspects include the piezoelectric thin film including AlN, ScAlN, ZnO, $LiNbO_3$/$LiTaO_3$, or PZT. Yet further aspects include the patterned second electrode including an IDT electrode. Other aspects include the patterned second electrode including over etched regions in an upper surface over the first and second self-aligned cavities.

Yet another aspect of the present disclosure includes a method including forming a sacrificial layer over a substrate; forming a first electrode over the sacrificial layer; forming a piezoelectric thin film over the first electrode; forming a second electrode over the piezoelectric thin film; etching through the second electrode down to the piezoelectric thin film forming self-aligned vias; forming and patterning a photoresist layer over the self-aligned vias; etching through the photoresist layer, forming cavities extending through the vias and to the sacrificial layer, wherein an over etch is formed in the second electrode over the cavities; and removing the sacrificial layer forming a cavity gap under the cavities and first metal electrode.

Aspects of the present disclosure include RIE through the photoresist layer forming the cavities. Other aspects include removing the sacrificial layer by mechanical and/or chemical etching. Additional aspects include removing the photoresist layer after the cavity gap is formed. Yet other aspects include forming a piezoelectric thin film of AlN, ScAlN, ZnO, $LiNbO_3$/$LiTaO_3$, or PZT; forming the first and second electrodes of metal including Mo, Cr or W; and forming the second electrode as an IDT electrode.

Yet another aspect of the present disclosure includes a device having a self-aligning hardmask including a conductive material and including an outer edge and an opening disposed within a perimeter of the edge, wherein the opening is positioned over a patterned layer that defines a cavity via.

Aspects include the edge having an oval shape, elliptical shape or polygonal shape, and the conductive material comprises Mo, Cr, or W. Other aspects include an electrode including Mo, Cr, or W, wherein the self-aligning hardmask and electrode are formed of the same conductive material, and patterned with the same processing step to pattern the electrode and ensure self alignment between the cavity via and the electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of misalignment between a cavity via and an IDT electrode layer attendant upon forming a Lamb wave filter. The present disclosure controls overlay misalignment to less than 10 nm by providing a self-aligned cavity via.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
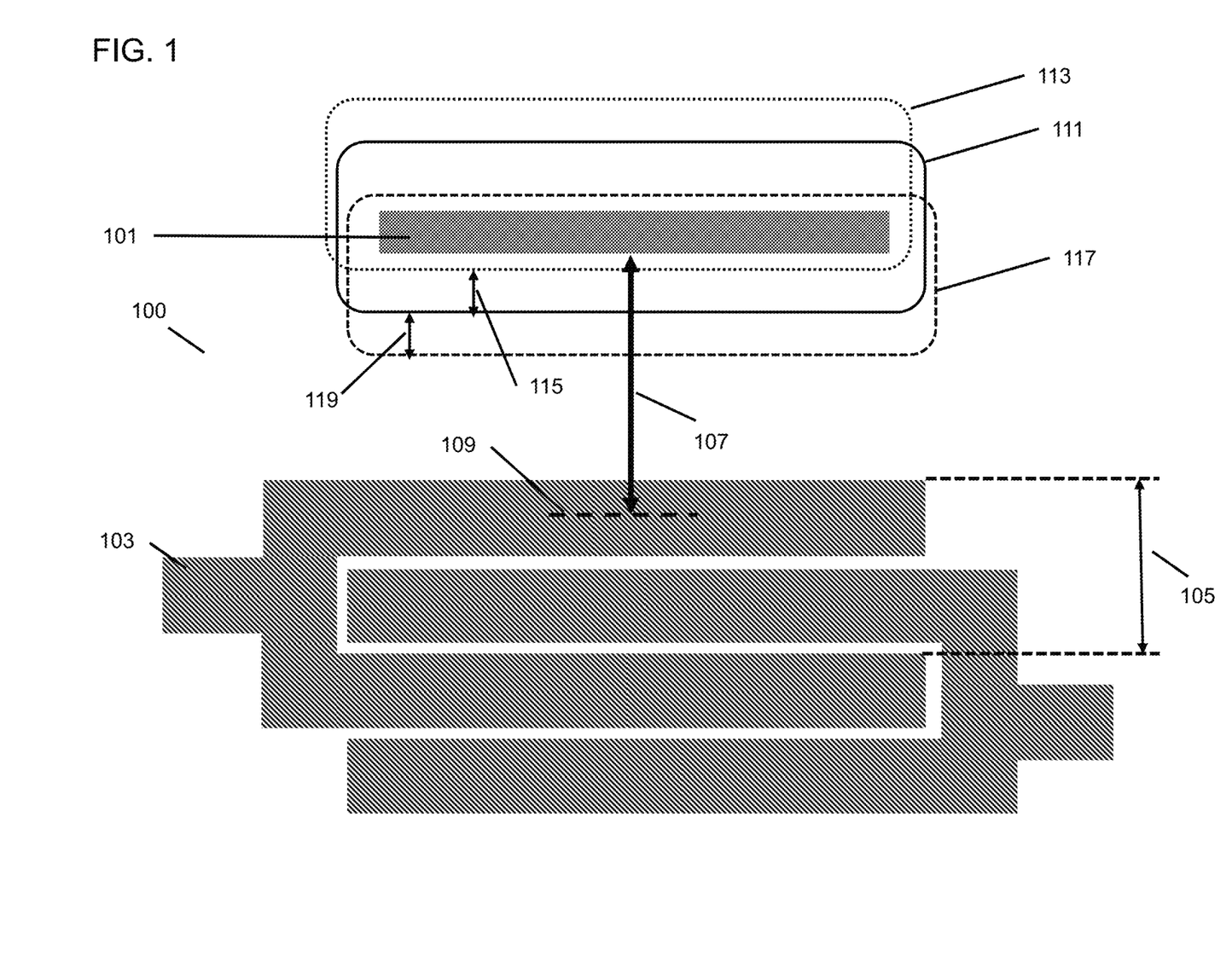
FIGS. 1 and 2 schematically illustrate, in top view, a design for a filter prior to formation one or more cavities, in accordance with an exemplary embodiment.

Adverting to FIG. 1, a partial top view of a filter 100 is illustrated. Cavity via layer 101 is disposed at a distance from top electrode 103. Cavity via layer 101, when patterned, extends down along one or more sides of the top electrode 103 down through a piezoelectric thin film and down to a cavity gap below the piezoelectric thin film. Top electrode 103 is an IDT composed of metal including Mo, Cr or W. A pitch 105 (represented by $\lambda$ in meters (m)) of the top electrode 103 controls frequency f in hertz (Hz). The equation for frequency is $f=c/\lambda$. Variable c is wave speed in meters/second (m/s). Bi-directional arrow 107 represents a distance $n\lambda/4$ between an edge of cavity via layer 101 and a middle 109 of the top electrode 103. Variable n is the multiple of $\lambda/4$.

Cavity via layer 101 is aligned in the center of boundary 111, and represents a designed cavity via alignment for formation of one or more cavity vias during photolithography. Boundary 113 represents a cavity via misalignment of $+\Delta$, represented by bi-directional arrow 115, away from the middle 109 of the top electrode 103. Boundary 117 represents a cavity via misalignment of $-\Delta$, represented by bi-directional arrow 119, away from the middle 109 of the top electrode 103.

Figure 2:
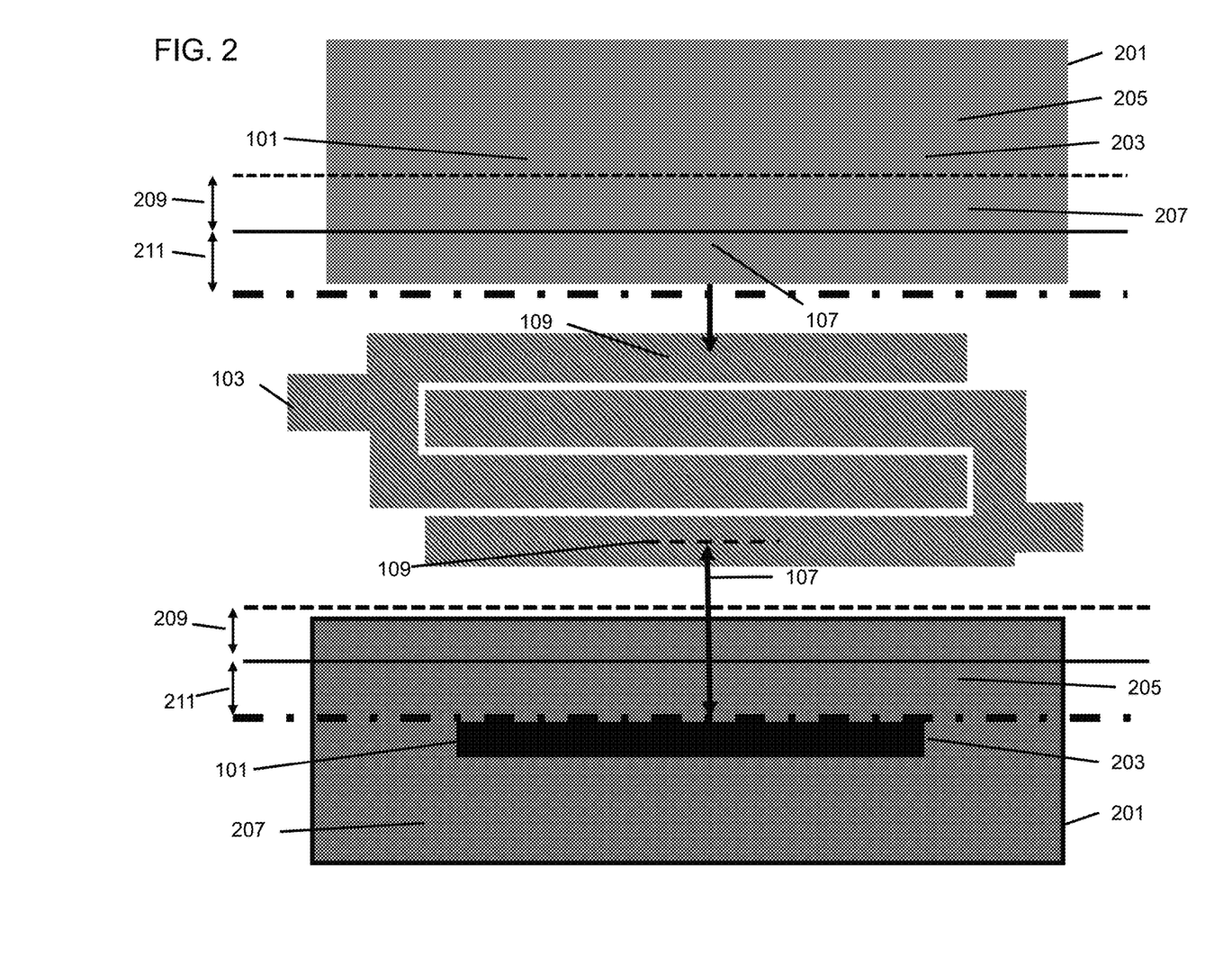

As shown in FIG. 2, a self-aligner 201 is used to form a cavity via that is closest to a designed cavity via pattern. In FIG. 2, a cavity via layer 101 is formed on both sides of the top electrode 103. The cavity via layers 101 are disposed within a clear area 203 of the self-aligner 201. The clear area 203 represents the region in which the cavity via is to be formed in the cavity via layer 101 during patterning. Boundary 205 represents a designed cavity via alignment for formation of the cavity via during photolithography. Boundary 207 represents a cavity via misalignment of $+\Delta$ or $-\Delta$ from the designed boundary 205, represented by bi-directional arrows 209 and 211, respectively.

Figure 3A:
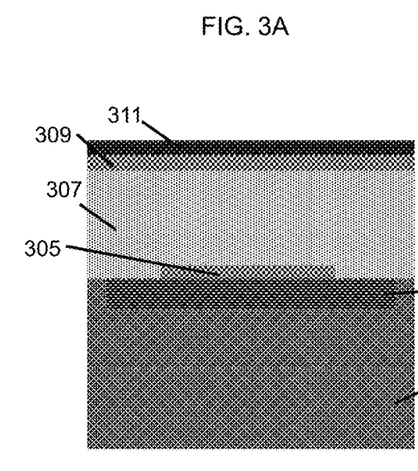
FIGS. 3A through 3F schematically illustrate, in cross section, a process flow for formation of a filter, in accordance with one exemplary embodiment.

FIG. 3A through FIG. 3G represent a process flow, in cross-section view, with a dielectric hardmask (self aligner) for top metal electrode selectivity. In FIG. 3A, a substrate 301 is illustrated on which a sacrificial layer 303 is deposited. A first metal electrode 305 is formed over a portion of the sacrificial layer 303 at a thickness of tens of nanometers (nm) to hundreds of nm, e.g. 10 to 200 nm. A piezoelectric thin film 307 is formed over the first metal electrode 305 at a thickness of hundreds of nanometers (nm) to units of micrometers, e.g. 1 micrometer (μm). The piezoelectric thin film 307 is formed of AlN, ScAlN, ZnO, $LiNbO_3/LiTaO_3$, or PZT. A second metal electrode 309, which represents a top metal electrode, is deposited over the piezoelectric thin film 307 at a thickness of tens of nm to hundreds of nm, e.g. 10 to 200 nm. The first and second metal electrodes 305 and 309 are formed of a metal selected from Mo, Cr or W. The second metal electrode 309 is an IDT electrode. A dielectric hardmask 311 is deposited over the second metal electrode 309 and serves as the self-aligner and is formed to a thickness of tens of nm to hundreds of nm, e.g. 10 to 200 nm.

Figure 3B:
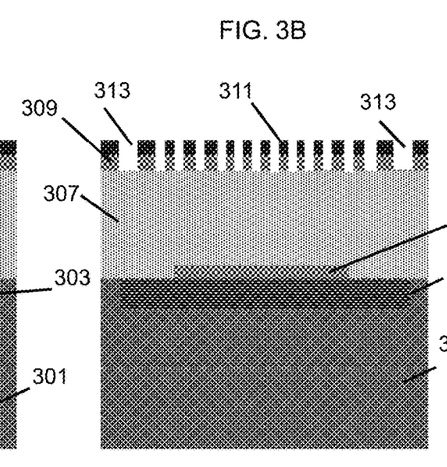
Figure 3C:
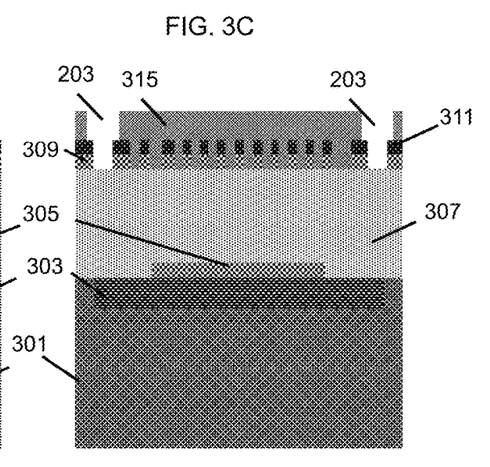
Figure 3D:
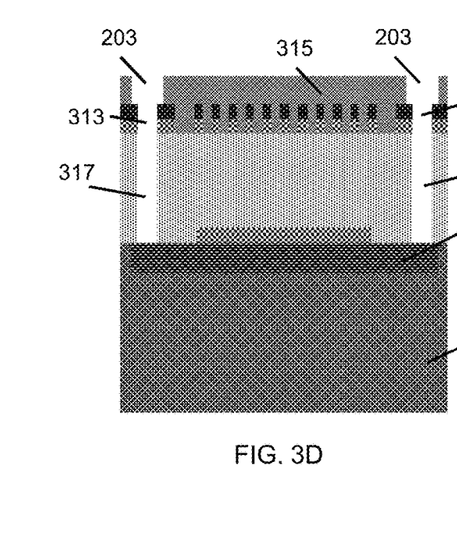

In FIG. 3B, a patterning step is performed to etch through the dielectric hardmask 311 and the second metal electrode 309 down to the piezoelectric thin film 307 forming self-aligned vias 313. The dielectric hardmask 311 functions as the self-aligner and is retained following the etching. In FIG. 3C, a photolithographic definition of the cavity vias is performed. In particular, a photoresist layer 315 is formed and patterned over the self-aligned vias 313. Clear areas 203 are formed which provide the photolithographic definition of the cavities to be formed. In FIG. 3D, the piezoelectric thin film 307 is etched through the photoresist layer 315 forming cavities 317 extending through the self-aligned vias 313 and down to an upper surface of the sacrificial layer 303. RIE is used to form the cavities 317.

Figure 3E:
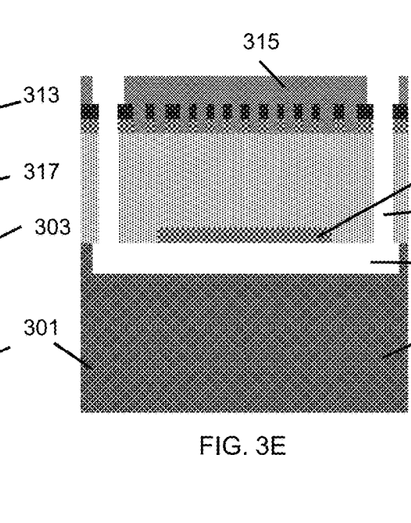
Figure 3F:
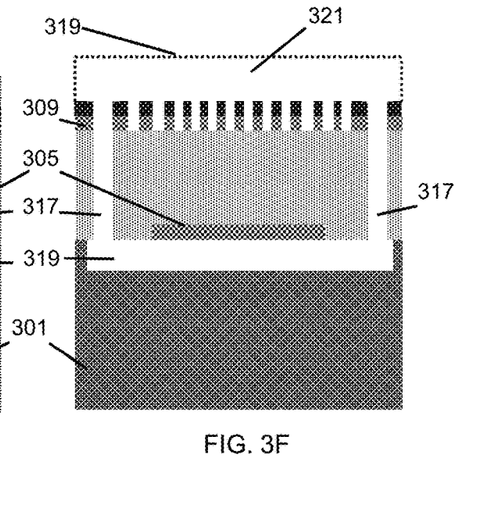

In FIG. 3E, the sacrificial layer 303 is removed forming a cavity gap 319 under the cavities 317 and first metal electrode 305 by way of a venting process. In particular, the sacrificial layer 303 is removed by mechanical and/or chemical etching. Following the formation of the cavity gap 319, the photoresist layer 315 is then stripped. As shown in FIG. 3F, the cavities 317 are connected by way of the cavity gap 319.

Figure 3G:
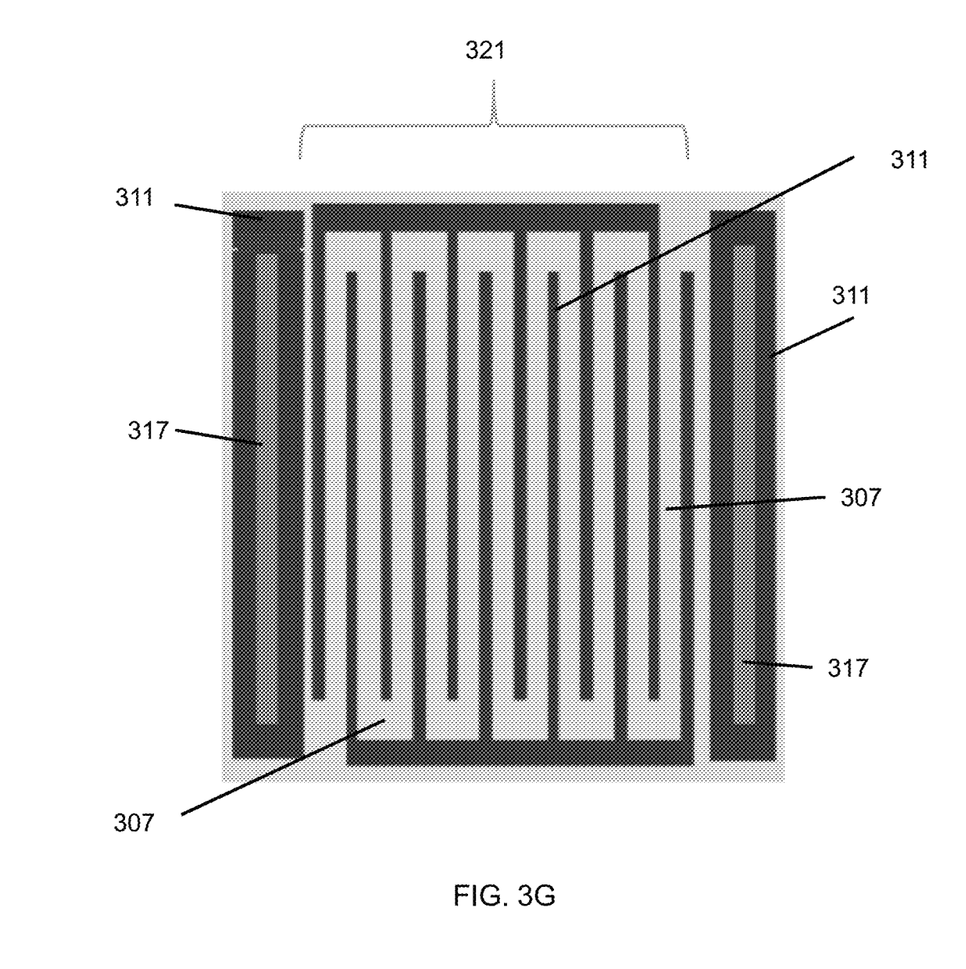
FIG. 3G is a top view of FIG. 3F.

FIG. 3G is a top view of FIG. 3F. The dielectric hardmask 311 is formed around the cavities 317 which extend down to the cavity gap 319. The pattern of dielectric hardmask 311 in region 321 corresponds to the underlying second metal electrode 309 between the cavities 317. Piezoelectric thin film 307 in region 321 is shown disposed between the dielectric hardmask 311. Additional processing steps are performed consistent with conventional processing to form an upper support 319 and a second cavity gap 321 between the upper support 319 and the second metal electrode 309.

Figure 4A:
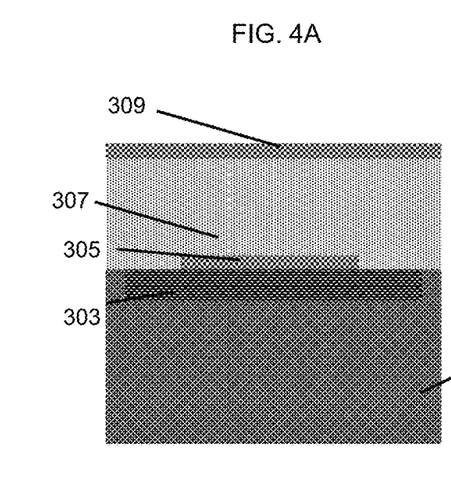
FIGS. 4A through 4F schematically illustrate, in cross section, a process flow for formation of a filter, in accordance with another exemplary embodiment.
Figure 4B:
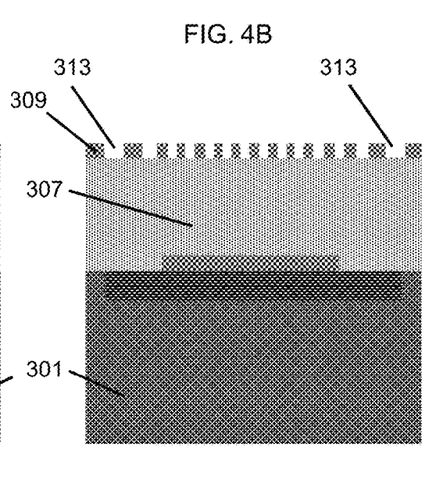
Figure 4C:
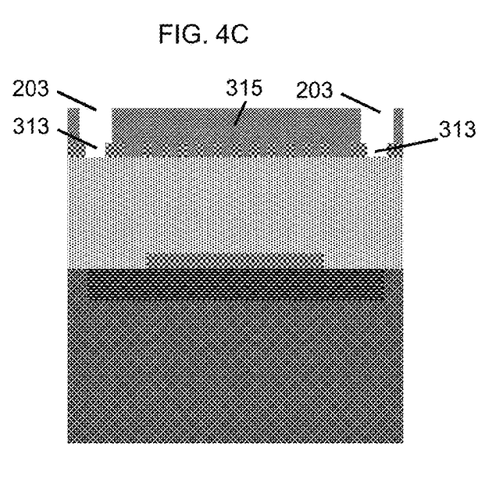
Figure 4D:
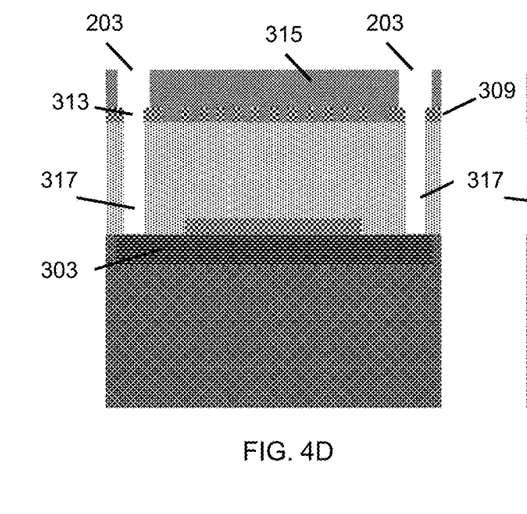

FIG. 4A through FIG. 4F illustrate another embodiment using the top metal electrode as the self-aligner without using a dielectric hardmask. The top metal electrode has an etch selectivity to the AlN of the piezoelectric thin film. In FIG. 4A, a substrate 301 is illustrated on which a sacrificial layer 303 is deposited. A first metal electrode 305 is formed over a portion of the sacrificial layer 303. A piezoelectric thin film 307 is formed over the first metal electrode 305. The piezoelectric thin film 307 is formed of AlN, ScAlN, ZnO, $LiNbO_3$/$LiTaO_3$, or PZT. A second metal electrode 309, which represents a top metal electrode and self aligner, is deposited over the piezoelectric thin film 307. The first and second metal electrodes 305 and 309 are formed of a metal selected from Mo, Cr or W. The second metal electrode 309 is an IDT electrode. Dimensions of each layer correspond to those of the first embodiment In FIG. 4B, a patterning step is performed to etch through the second metal electrode 309 down to the piezoelectric thin film 307 forming self-aligned vias 313. The second metal electrode 309 functions as the self-aligner and is retained following the etching. In FIG. 4C, a photolithographic definition of the cavity vias is performed. In particular, a photoresist layer 315 is formed and patterned over the self-aligned vias 313. Clear areas 203 are formed which provide the photolithographic definition of the cavities to be formed. In FIG. 4D, the piezoelectric thin film 307 is etched through the photoresist layer 315 forming cavities 317 extending through the self-aligned vias 313 and down to an upper surface of the sacrificial layer 303. RIE is used to form the cavities 317.

Figure 4E:
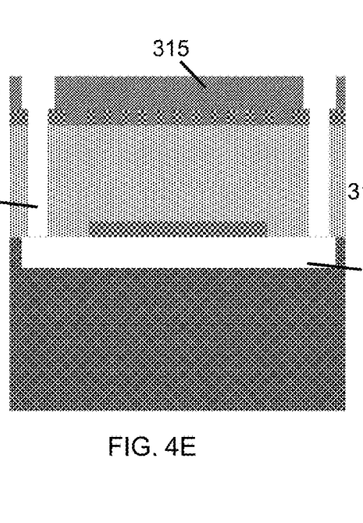
Figure 4F:
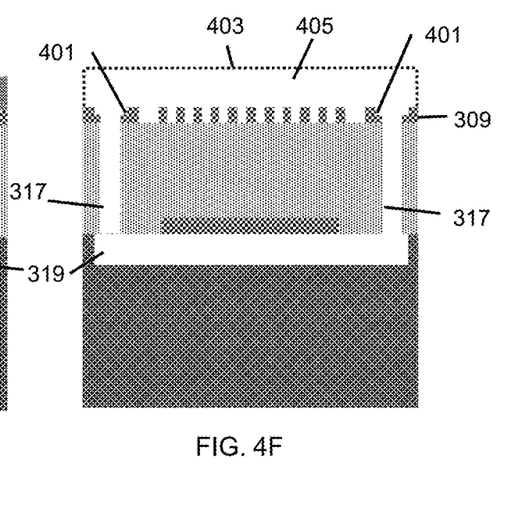

In FIG. 4E, the sacrificial layer 303 is removed forming a cavity gap 319 under the cavities 317 and first metal electrode 305 by way of a venting process. In particular, the sacrificial layer 303 is removed by mechanical and/or chemical etching. Following the formation of the cavity gap 319, the photoresist layer 315 is then stripped. As shown in FIG. 4F, the cavities 317 are connected by way of the cavity gap 319.

In FIG. 4F, the patterned second electrode 309 includes over etched regions 401 in an upper surface over the first and second self-aligned vias 313. Additional processing steps are performed consistent with conventional processing to form an upper support 403 and a second cavity gap 405 between the upper support 403 and the second metal electrode 309.

The embodiments of the present disclosure can achieve several technical effects, including a cleaner frequency response without spurious modes due to perfectly-aligned (i.e., self-aligned) IDT electrodes and cavity vias. Enhanced frequency control of the filters is obtainable due to controlled acoustic boundary conditions. Customizable acoustic boundary conditions provide modifications of filter's response parameters. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. Other industrial applications include monolithic integrated filter and RF silicon-on-insulator (SOI) devices, monolithic duplexers modules integrated with RF SOI, monolithic filter bank above RF SOI switches and control circuit, monolithic RF front-end module components, and multi-band RF front-end module integrating Lamb acoustic wave filters. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising a first region and a second region laterally adjacent to the first region, wherein the device comprises:
   a substrate;
   a first metal electrode formed over the substrate;
   a first cavity gap disposed between the substrate and first metal electrode;
   a piezoelectric thin film formed over the first metal electrode;
   a patterned second metal electrode formed over the piezoelectric thin film;
   a patterned dielectric hardmask formed directly on the patterned second metal electrode without any intervening layer, wherein a pattern of the dielectric hardmask is the same as a pattern of the second metal electrode, wherein the pattern of the dielectric hardmask and second metal electrode comprise a plurality of openings extending from an upper surface of the patterned dielectric hardmask down to an upper surface of the piezoelectric thin film, wherein a portion of the patterned dielectric hardmask is disposed only in the first region and comprises an outer edge so that a perimeter of the outer edge surrounds at least one of the openings;
   first and second self-aligned cavities disposed based on the locations of the openings in the first region and extending through the patterned second metal electrode and the patterned dielectric hardmask down to the first cavity gap, wherein the first cavity gap connects the first and second self-aligned cavities;
   an upper support formed over the patterned second metal electrode; and a second cavity gap disposed between the patterned second metal electrode and the upper support.

2. The device according to claim 1, wherein the first metal electrode and the second patterned metal electrode comprise a metal selected from molybdenum (Mo), chromium (Cr), or tungsten (W).

3. The device according to claim 1, wherein:
the device is an acoustic resonator filter,
the piezoelectric thin film forms an acoustic layer,
the second metal electrode transduces an acoustic signal from the acoustic layer and determines a central resonance frequency of the filter, and
the first and second self-aligned cavities provide frequency control of a resonance frequency of the acoustic resonator filter by fixing a distance between the second metal electrode and the first and second self-aligned cavities.

4. The device according to claim 1, wherein the piezoelectric thin film comprises aluminum nitride (AlN) scandium-doped AlN (ScAlN), zinc oxide (ZnO), lithium niobate (LiNbO$_3$), lithium tantalate (LiTaO$_3$), or lead zirconate titanate (PZT).

5. The device according to claim 1, wherein the patterned second metal electrode comprises an interdigital transducer (IDT) electrode.

6. The device according to claim 1, wherein the patterned second metal electrode includes etched regions in an upper surface over the first and second self-aligned cavities.

7. A device comprising a first region and a second region laterally adjacent to the first region, wherein the device comprises:

a self-aligning dielectric hardmask, disposed in the first region and the second region, wherein the self-aligning dielectric hardmask disposed in the first region comprises an outer edge and an opening surrounded by a perimeter of the outer edge; and a metal electrode, disposed in the first region and the second region, wherein the self-aligning dielectric hardmask disposed in the first region is formed directly on the metal electrode in the first region without any intervening layer, wherein a portion of the metal electrode is disposed in the first region, and the portion of the metal electrode is spaced apart from the metal electrode disposed in the second region when viewed from a top down perspective, wherein the opening is positioned over a patterned layer that defines a cavity via, and wherein the self-aligning dielectric hardmask and the metal electrode have the same pattern which provides self-alignment between the cavity via and the metal electrode, wherein the device is a lamb acoustic wave resonator.

8. The device according to claim 7, wherein:
the outer edge has an oval shape, elliptical shape or polygonal shape.

9. The device according to claim 7, wherein the metal electrode comprises Mo, Cr, or W.

* * * * *